US010239783B2

(12) United States Patent
Hanekawa et al.

(10) Patent No.: US 10,239,783 B2
(45) Date of Patent: Mar. 26, 2019

(54) METHOD OF PRODUCING GLASS SUBSTRATE AND GLASS SUBSTRATE

(71) Applicant: Asahi Glass Company, Limited, Tokyo (JP)

(72) Inventors: Hiroshi Hanekawa, Tokyo (JP); Nobutaka Aomine, Tokyo (JP); Yuki Aoshima, Tokyo (JP); Hirotomo Kawahara, Tokyo (JP); Kazunobu Maeshige, Tokyo (JP)

(73) Assignee: AGC INC., Tokyo (JP)

( * ) Notice: Subject to any disclaimer, the term of this patent is extended or adjusted under 35 U.S.C. 154(b) by 0 days.

(21) Appl. No.: 15/730,448

(22) Filed: Oct. 11, 2017

(65) Prior Publication Data
US 2018/0044229 A1    Feb. 15, 2018

Related U.S. Application Data

(60) Division of application No. 14/552,053, filed on Nov. 24, 2014, which is a continuation of application No. PCT/JP2013/064087, filed on May 21, 2013.

(30) Foreign Application Priority Data

May 24, 2012    (JP) ................ 2012-118997

(51) Int. Cl.
*H05H 1/24*    (2006.01)
*C03C 17/245*    (2006.01)
(Continued)

(52) U.S. Cl.
CPC ........ *C03C 17/245* (2013.01); *C03C 17/3411* (2013.01); *C03C 17/36* (2013.01);
(Continued)

(58) Field of Classification Search
CPC ... C03C 17/245; C03C 17/3411; C03C 17/36; C03C 17/366; C23C 16/40; G02B 1/11; G02B 5/08; G02B 5/208
See application file for complete search history.

(56) References Cited

U.S. PATENT DOCUMENTS

| 5,821,001 | A | 10/1998 | Arbab et al. |
| 6,159,621 | A | 12/2000 | Schicht et al. |
| 2002/0041967 | A1 | 4/2002 | Nakamura et al. |

FOREIGN PATENT DOCUMENTS

| JP | 07-188930 A | 7/1995 |
| JP | 07188930 A | * 7/1995 |

(Continued)

OTHER PUBLICATIONS

Idris et al. Film characteristics of low-tempearture plasma-enhanced chemical vapor deposition silicon dioxide using tetraisocyanatesilane and oxygen, Jpn J Appl Phys, vol. 37, 1998, pp. 6562-6568. (Year: 1998).*

(Continued)

*Primary Examiner* — Kelly M Gambetta
(74) *Attorney, Agent, or Firm* — Rothwell, Figg, Ernst & Manbeck, P.C.

(57) ABSTRACT

A method of producing a glass substrate having a first layer formed on a surface of the substrate by low-temperature CVD includes preparing the glass substrate and forming the first layer on the glass substrate by the low-temperature CVD. In the glass substrate after forming the first layer, an integrated value after a baseline correction in a wavenumber range of 2600 $cm^{-1}$ to 3800 $cm^{-1}$ in a peak due to OH groups obtained by an FTIR measurement on the first layer is 9.0 or less, and the C content of the first layer is 1.64 at % or less.

12 Claims, 9 Drawing Sheets

(51) Int. Cl.

| | |
|---|---|
| *C23C 16/40* | (2006.01) |
| *G02B 1/11* | (2015.01) |
| *G02B 5/08* | (2006.01) |
| *G02B 5/20* | (2006.01) |
| *C03C 17/34* | (2006.01) |
| *C03C 17/36* | (2006.01) |

(52) U.S. Cl.
CPC ............ *C03C 17/366* (2013.01); *C23C 16/40* (2013.01); *G02B 1/11* (2013.01); *G02B 5/08* (2013.01); *G02B 5/208* (2013.01); *C03C 2217/73* (2013.01); *C03C 2218/152* (2013.01); *C03C 2218/153* (2013.01)

(56) References Cited

FOREIGN PATENT DOCUMENTS

| JP | 2002105641 | A | 4/2002 | |
|---|---|---|---|---|
| JP | 3291401 | B1 | 6/2002 | |
| JP | 2002-348145 | A | 12/2002 | |
| JP | 2004-107788 | A | 4/2004 | |
| JP | 2006-215081 | A | 8/2006 | |
| JP | 2007-113031 | A | 5/2007 | |
| WO | 2010098200 | A1 | 9/2010 | |
| WO | WO-2010098200 | A1 * | 9/2010 | ............. C03C 17/36 |

OTHER PUBLICATIONS

International Search Report dated Aug. 27, 2013, in International Application No. PCT/JP2013/064087, 2 pages.
Seaman et al. "High Quality, High Rate Coatings by Plasma Enhanced Chemical Vapor Deposition on Large Area Substrates" AIMCAL Technical Conference, 2011, 8 pages.
Extended European Search Report dated Nov. 4, 2015, issued in European Patent Application No. 13793436.0, 2 pages.
Idris et al. "Film Characteristics of Low-Temperature Plasma-Enhanced Chemical Vapor Deposition Silicon Dioxide Using Tetraisocyanatesilane and Oxygen" Japanese Journal of Applied Physics, vol. 37, No. 12A, Part 1, pp. 6562-6568, 1998, 7 pages.

* cited by examiner

METHOD OF PRODUCING GLASS SUBSTRATE AND GLASS SUBSTRATE

CROSS-REFERENCE TO RELATED APPLICATIONS

The present application is a divisional of application Ser. No. 14/552,053 filed on Nov. 24, 2014, which is a continuation application filed under 35 U.S.C. 111(a) claiming benefit under 35 U.S.C. 120 and 365(c) of PCT International Application No. PCT/JP2013/064087, filed on May 21, 2013 and designating the U.S., which claims priority to Japanese Patent Application No. 2012-118997, filed on May 24, 2012. The entire contents of the foregoing applications are incorporated herein by reference.

BACKGROUND OF THE INVENTION

1. Field of the Invention

The present invention relates to a method of producing a glass substrate having one or two or more layers deposited on its surface by a low-temperature CVD process, and to a glass substrate having one or two or more layers deposited on its surface by a low-temperature CVD process.

2. Description of the Related Art

The CVD (chemical vapor deposition) process is a technique that deposits a film of a target substance onto a substrate using a chemical reaction of a source gas. The CVD process is characterized by its capability to deposit a relatively uniform film even when a substrate surface has irregularities, and has been widely used in various kinds of fields.

Recently, it has been studied to perform a film deposition process at higher speed by supplying a large amount of precursor at a time. For example, Non-Patent Document 1 describes the technique of depositing a $SiO_2$ film on a glass substrate at high speed by a plasma-enhanced CVD (PECVD) process, which is a kind of CVD process at low temperatures.

Reference may be made to, for example, AIMCAL technical Conference, 2011, presentation title "High Quality, High Rate Coatings by Plasma Enhanced Chemical Vapor Deposition on Large Area Substrates" for related art.

SUMMARY OF THE INVENTION

According to an aspect of the present invention, a method of producing a glass substrate having a first layer formed on a surface of the substrate by low-temperature CVD includes preparing the glass substrate and forming the first layer on the glass substrate by the low-temperature CVD. In the glass substrate after forming the first layer, an integrated value after a baseline correction in a wavenumber range of 2600 $cm^{-1}$ to 3800 $cm^{-1}$ in a peak due to OH groups obtained by an FTIR measurement on the first layer is 9.0 or less, and the C content of the first layer is 1.64 at % or less.

According to an aspect of the present invention, a glass substrate has a first layer formed on a surface of the glass substrate by low-temperature CVD. In the glass substrate, an integrated value after a baseline correction in a wavenumber range of 2600 $cm^{-1}$ to 3800 $cm^{-1}$ in a peak due to OH groups obtained by an FTIR measurement on the first layer is 9.0 or less, and the C content of the first layer is 1.64 at % or less.

DETAILED DESCRIPTION OF THE PREFERRED EMBODIMENTS

Figure 1A:
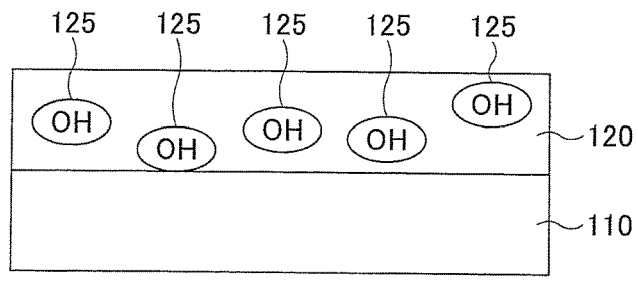
FIGS. 1A, 1B, 1C and 1D are schematic diagrams for illustrating a problem caused when a glass substrate with a thin film produced by a conventional low-temperature CVD process is subjected to a heat treatment.

As described above, recently, a study has been made in particular of the technique of depositing a film of a target substance onto a glass substrate at high speed by a CVD process at low temperatures (hereinafter referred to as "high-speed low-temperature CVD process").

The inventors of the present invention, however, have found a problem in that a layer deposited by such a "high-speed low-temperature CVD process" has a relatively poor heat resistance. For example, it has been observed that a large number of cracks are generated in the $SiO_2$ film when a glass substrate having the $SiO_2$ film deposited by the method illustrated in Non-Patent Document 1 described above is heated to approximately 650° C. to 750° C.

On the other hand, in the field of glass industry, it is assumed that the case of subjecting a glass substrate having a thin film-like layer formed on its surface by the "high-speed low-temperature CVD process" to such heat treatment as tempering or deforming the glass substrate in a post-process can be extremely common. Accordingly, the situation where the heat resistance of a glass substrate having a layer formed by the "high-speed low-temperature CVD process" becomes an issue may become conspicuous in the future.

It is well known that at this point, the characteristics of a layer formed by the low-temperature CVD process, such as abrasion resistance, are decreased by the effect of an impurity originating from an organic metal precursor. Accordingly, it is assumed that the above-described heat resistance also is affected by an impurity remaining in the layer. No reports, however, have been made of an impurity component concerning the heat resistance, nor have guidelines for improving heat resistance been clarified.

According to an aspect of the present invention, a method of producing a glass substrate having a layer with relatively good heat resistance formed on its surface by the low-temperature CVD process is provided.

According to an aspect of the present invention, a glass substrate having a layer with relatively good heat resistance formed on its surface by the low-temperature CVD process is provided.

A description is given below, with reference to the drawings, one or more embodiments of the present invention.

[Method of Producing a Glass Substrate with a Thin Film According to the Present Invention]

According to an aspect of the present invention, a method of producing a glass substrate having a first layer formed on its surface by low-temperature CVD includes (1) the step of preparing a glass substrate and (2) the step of forming a first layer on the glass substrate by the low-temperature CVD, where, in the glass substrate after the step (2), an integrated value after a baseline correction in a wavenumber range of 2600 $cm^{-1}$ to 3800 $cm^{-1}$ in a peak due to OH groups obtained by an FTIR measurement on the first layer is 9.0 or less, and the C content of the first layer is 1.64 at % or less.

In the present application, the "low-temperature CVD process (low-temperature CVD)" means CVD processes according to which a film deposition process is performed under a condition at relatively low substrate temperatures such as 100° C. or less, unlike high-temperature CVD processes such as thermal CVD processes. Examples of the "low-temperature CVD process (low-temperature CVD)" include plasma-enhanced CVD (PECVD) processes.

A large increase in substrate temperature may result during pre-processing of a substrate before a CVD process and the CVD process. Such a case as well is included in the "low-temperature CVD process (low-temperature CVD)" as long as a "positive" heating process up to temperatures exceeding 400° C. is not included.

As described above, a study has been made of the technique of depositing a film of a target substance at high speed by the low-temperature CVD process (hereinafter referred to as "high-speed low-temperature CVD process"). As described below, however, there is a problem in that normally, films deposited by such a "high-speed low-temperature CVD process" have relatively poor heat resistance.

As a result of a diligent study, the inventors of the present application have found that in a glass substrate on which a thin film-like layer is formed by the low-temperature CVD process, there is a correlation between the area of a peak due to OH groups obtained by FTIR spectroscopy on the layer and the heat resistance of the layer. At this point, the FTIR absorbance of the layer is measured by performing an FTIR spectroscopy measurement on a glass substrate on which a film is deposited and a glass substrate of the same kind on which no film is deposited and taking a difference between their respective absorbances. Furthermore, the inventors of the present application have found that it is possible to obtain a glass substrate on which a layer having good heat resistance is formed when the layer is formed in such a manner as to make the peak area due to OH groups have a predetermined value or less, thus arriving at the present invention.

That is, the glass substrate with a thin film produced by the method according to the present invention is characterized in that the integrated value (after a baseline correction) of a peak due to OH groups in the wavenumber range of 2600 $cm^{-1}$ to 3800 $cm^{-1}$ obtained by an FTIR measurement on the thin film is controlled to 9.0 or less. That is, according to the method of producing a glass substrate with a thin film according to the present invention, the content of OH groups contained in the thin film is significantly controlled.

Furthermore, the glass substrate with a thin film produced by the method according to the present invention is characterized in that the content of C (carbon) contained in the first layer is controlled to 1.64 at % or less (normally, C (carbon) is mixed into the thin film from the precursor side).

In this case, as described below, the effect is attained that the heat resistance of the glass substrate with a thin film is significantly improved.

Consequently, according to the method of producing a glass substrate with a thin film of the present invention, it is possible to provide a glass substrate with a thin film that has relatively good heat resistance.

Here, the reason the glass substrate with a thin film produced by the method according to the present invention has relatively good heat resistance is discussed with reference to FIGS. 1A, 1B, 1C and 1D.

FIGS. 1A through 1D schematically illustrate how a $SiO_2$ thin film deposited on a glass substrate by the conventional low-temperature CVD process changes when being subjected to a heat treatment.

FIG. 1A illustrates a state before a glass substrate 110 with a $SiO_2$ thin film is heated.

A $SiO_2$ thin film 120 deposited by the low-temperature CVD process is placed over the glass substrate 110. In depositing the $SiO_2$ thin film 120 deposited by the low-temperature CVD process, normally, an organometallic compound gas of tetramethyldisiloxane or the like is used as a source gas.

Here, because the film deposition temperature is relatively low (for example, approximately 20° C. to 100° C.) by the low-temperature CVD process, it is assumed that OH groups 125 originating from the organometallic compound gas that is a precursor are captured into the deposited $SiO_2$ thin film 120. In particular, when the $SiO_2$ thin film 120 is deposited by a high-speed film deposition process, a large amount of OH groups 125 may be captured into the $SiO_2$ thin film 120 as a result of an increase in the amount of an unreacted precursor.

Figure 1B:
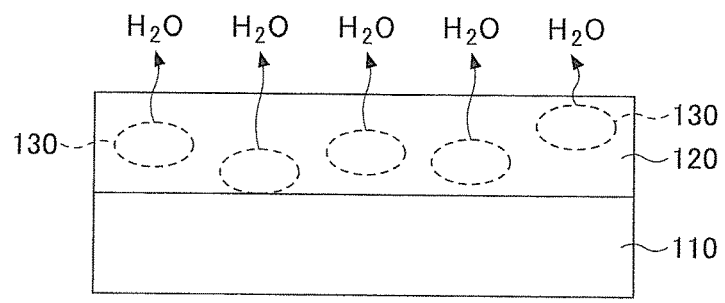

When the glass substrate 110 with this $SiO_2$ thin film 120 is heated, moisture ($H_2O$) is generated from the OH groups 125 contained in the $SiO_2$ thin film 120 as illustrated in FIG. 1B. This moisture is discharged outside from the $SiO_2$ thin film 120. Therefore, a large number of holes 130 are formed at positions where the OH groups 125 are present in the heated $SiO_2$ thin film 120.

Here, the glass substrate 110 with the $SiO_2$ thin film 120 is still heated. Therefore, the holes 130 formed in the $SiO_2$ thin film 120 are reduced with progress in the sintering and densification of the $SiO_2$ thin film 120, so as to disappear. As indicated by arrows A of FIG. 1C, because the volume of the $SiO_2$ thin film 120 is reduced by the densification, the $SiO_2$ thin film 120 becomes smaller in size than the glass substrate 110.

Figure 1C:
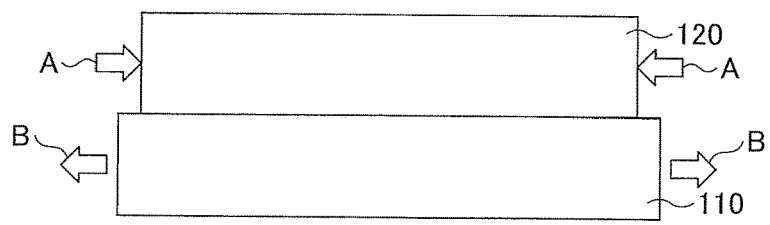

On the other hand, the glass substrate 110 expands because of heating. That is, as illustrated in FIG. 1C, the glass substrate 110 expands to extend in the directions of arrows B during heating. Because of such expansion of the glass substrate 110 in the directions of arrows B, tensile forces are also applied to the densified $SiO_2$ thin film 120 in the directions of arrows B. This causes microscopic or macroscopic breakage in the densified $SiO_2$ thin film 120.

Figure 1D:
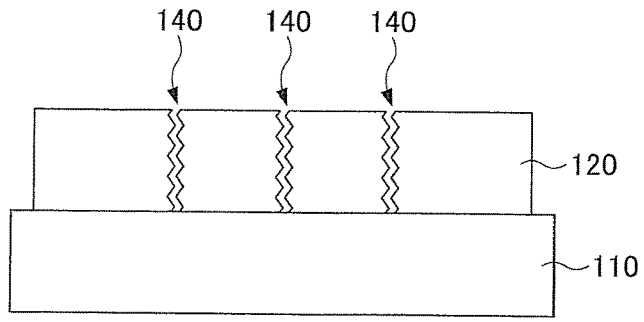

As a result, after the heat treatment, defects such as cracks 140 are assumed to be formed in the densified $SiO_2$ thin film 120 as illustrated in FIG. 1D.

On the other hand, according to an aspect of the present invention, the content of OH groups contained in a thin film deposited by the low-temperature CVD process is significantly controlled. Therefore, in the glass substrate with a thin film produced by the method according to the present invention, the reaction of OH groups to change to water is less likely to occur at the time of performing heat treatment. Furthermore, because the amount of water discharged outside is reduced, the number of holes formed in the thin film during heat treatment is reduced, so that the thin film is less likely to be densified. It is assumed that as a result, defects such as cracks are less likely to be caused in the thin film even when heat treatment is performed, so that the heat resistance of the glass substrate with a thin film improves.

The behavior illustrated in FIGS. 1A through 1D is merely a model thought up from experimental results by the inventors of the present application at this point. Accordingly, it is necessary to note that the heat resistance of the glass substrate with a thin film produced by the method according to the present invention may have been improved by other mechanisms.

While the model described above using FIGS. 1A through 1D focuses mainly on the effect of OH groups contained in the thin film, the case where the thin film contains a C (carbon) component may be considered in the same manner.

That is, when, for example, a C component originating from a precursor is present in the thin film, it is highly likely that such a C component is present, being attached to H atoms like, for example, a $—CH_3$ group. Accordingly, when such a C component originating from a precursor is present in the first layer, the C component becomes moisture and carbon dioxide at the time of heat treatment so as to be removed from inside the thin film like in the above-described case of OH groups. Furthermore, resultant holes are combined to densify the thin film. It is assumed that as a result, defects such as cracks are more likely to be caused in the thin film after heat treatment.

The glass substrate with a thin film produced by the method according to the present invention, however, is characterized in that the content of C (carbon) contained in the first layer is controlled to 1.64 at % or less. Therefore, in the glass substrate with a thin film produced by the method according to the present invention, a phenomenon as described above is less likely to occur, so that the heat resistance of the thin film improves.

Figure 2:
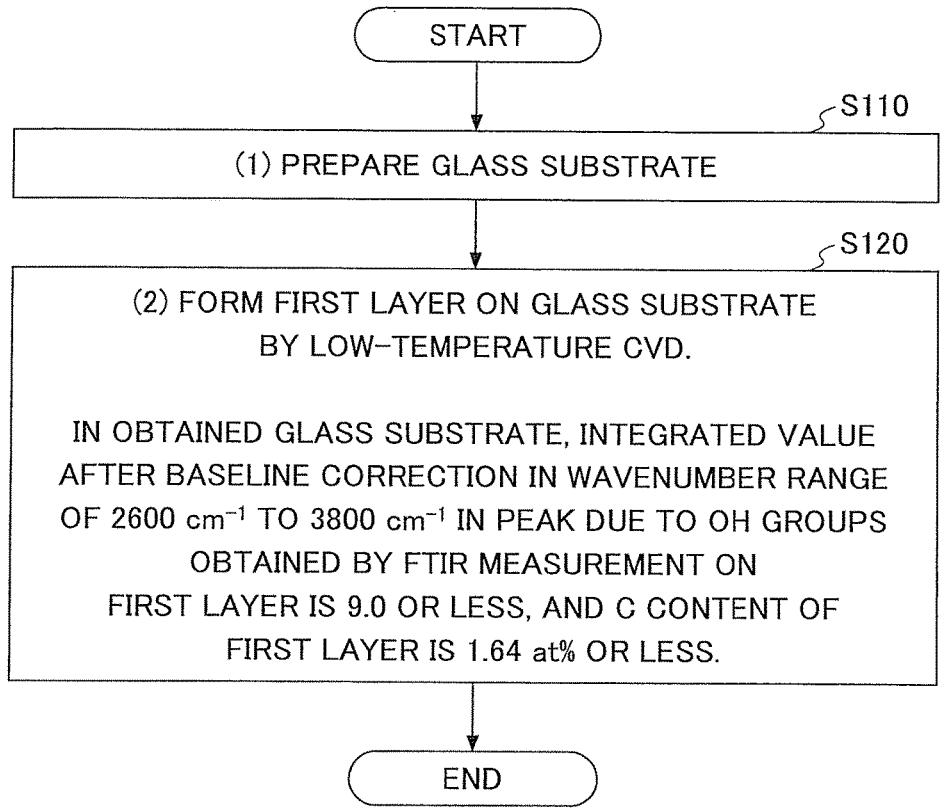
FIG. 2 is a flowchart schematically illustrating a method of producing a thin film material.

Next, a more detailed description is given, with reference to FIG. 2, of the method of producing a glass substrate with a thin film according to the present invention.

FIG. 2 is a flowchart schematically illustrating one example of the method of producing a glass substrate with a thin film according to the present invention. As illustrated in FIG. 2, one example of the method of producing a glass substrate with a thin film according to the present invention includes (1) the step (step S110) of preparing a glass substrate and (2) the step (step S120) of forming a first layer on the glass substrate by a low-temperature CVD process, where in the obtained glass substrate, an integrated value after a baseline correction in a wavenumber range of 2600 $cm^{-1}$ to 3800 $cm^{-1}$ in a peak due to OH groups obtained by an FTIR measurement on the first layer is 9.0 or less and the C content of the first layer is 1.64 at % or less.

Here, "an integrated value after a baseline correction" means an integrated value after correcting a baseline in the raw measurement data obtained by an FTIR measurement in the above-described wavenumber range.

A detailed description is given below of each step.

[Step S110]

First, a glass substrate on which a film is to be deposited is prepared. The size and material of the glass substrate are not limited in particular. The glass substrate may be, for example, soda-lime glass, alkali-free glass or the like.

The production method of a glass substrate is not limited in particular. The glass substrate may be produced by a conventionally known common method such as a float process.

[Step S120]

Next, a first layer is formed on the glass substrate by the low-temperature CVD.

As described above, unlike in high-temperature CVD processes such as thermal CVD processes, film deposition is performed at relatively low substrate temperatures in the low-temperature CVD. The low-temperature CVD may be, for example, a plasma-enhanced CVD (PECVD) process or the like. In this case, a plasma gas may be, for example, oxygen gas.

At the time of film deposition, the glass substrate prepared at step S110 described above is placed in a film deposition chamber. Normally, when the first layer is formed by the low-temperature CVD process, a source gas that serves as the material of the first layer is supplied into the film deposition chamber.

The inside of the film deposition chamber may be either a normal pressure environment or a reduced pressure environment. For example, in the case of a plasma-enhanced CVD (PECVD) process, the inside of the film deposition chamber is caused to be a reduced pressure environment by depressurization.

The deposited first layer is not limited to a particular kind. The first layer may be, for example, oxide, nitride and/or oxynitride.

Examples of oxides include $SiO_2$, $TiO_2$, ZnO, SnO and/or $Al_2O_3$. Examples of nitrides include $Si_3N_4$, TiN and AlN. Examples of oxynitrides include SiON and TiON.

The source gas may contain, for example, an organic metal precursor.

The organic metal precursor may have, for example, a siloxane bond and/or an alkoxide bond. Furthermore, the organic metal precursor may contain at least one component selected from the group consisting of a $—CH_3$ group, a —OH group, and a —H group. Furthermore, the organic metal precursor may contain at least one component selected from the group consisting of Si, Ti, Zn, Sn and Al. In this case, it is possible to deposit films of oxides, nitrides and oxynitrides of silicon, titanium, zinc, tin and aluminum.

Here, as described above, it is necessary to note that according to the method according to the present invention, the film deposition process is performed so that an integrated value after a baseline correction in a wavenumber range of 2600 $cm^{-1}$ to 3800 $cm^{-1}$ in a peak due to OH groups obtained by an FTIR measurement on the first layer is 9.0 or less.

In this case, as described above, it is possible to significantly improve the heat resistance of the glass substrate with a thin film.

Such control of the amount of OH groups may be performed relatively easily by, for example, controlling the amount of a precursor supplied at the time of forming the first layer to be in a predetermined range.

For example, in the case of depositing a $SiO_2$ thin film from organic metal precursors such as tetramethyldisiloxane and/or hexamethyldisiloxane, it is possible to deposit a SiO$_2$ thin film whose integrated value of a peak due to OH groups is 9.0 or less by causing the flow rate of the precursor to be approximately 125 sccm/m to 250 sccm/m.

The integrated value after a baseline correction in a wavelength range of 2600 cm$^{-1}$ to 3800 cm$^{-1}$ in a peak due to OH groups is preferably 7.0 or less and more preferably 5.5 or less.

Furthermore, it is necessary to note that according to the method according to the present invention, the film deposition process is performed so that the C (carbon) content of the first layer is 1.64 at % or less.

In general, according to the low-temperature CVD process, even when a source gas contains no C component, C may be detected in the deposited first layer as an impurity. The content of C originating from such an impurity, however, is expected to be not more than approximately 3.2 ppm. Accordingly, the above-described C (carbon) content condition (C.ltoreq.1.64 at %) is satisfied as long as a material containing a C component, such as an organic metal precursor, is not used as a material at the time of forming the first layer.

On the other hand, in the case of using a material containing a C component, such as an organic metal precursor, as a material at the time of forming the first layer, it is possible to control the amount of C (carbon) relatively easily by controlling the amount of supply of such an organic metal precursor to be in a predetermined range, or the like.

In particular, the content of C originating from a precursor is more preferably 1 at % or less.

The C content of the first layer may be measured by ESCA. That is, normally, the glass substrate itself contains no C. Therefore, the value obtained through the measurement result of an ESCA analysis of the whole glass substrate with a thin film may be understood as the C content of the first layer.

[About a Glass Substrate with a Thin Film According to the Present Invention]

Figure 3:
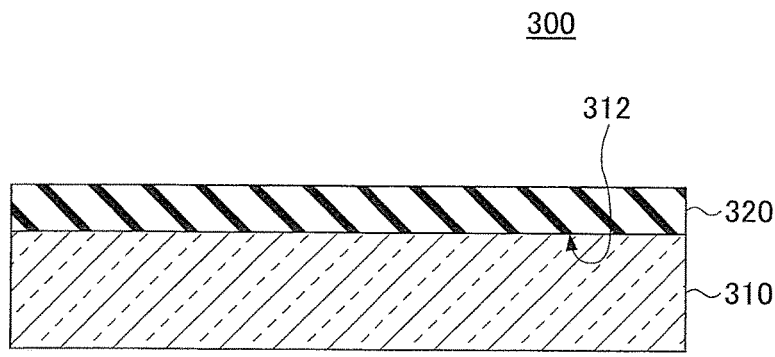
FIG. 3 is a cross-sectional view schematically illustrating a configuration of a glass substrate with a thin film.

Next, a description is given, with reference to FIG. 3, of a configuration of a glass substrate with a thin film provided by the present invention.

FIG. 3 illustrates a schematic cross-sectional view of a glass substrate with a thin film according to the present invention.

As illustrated in FIG. 3, a glass substrate with a thin film 300 according to the present invention includes a glass substrate 310 and a first layer 320 formed on a surface 312 of the glass substrate 310.

The glass substrate 310 is not limited to a particular kind. The glass substrate 310 may be, for example, soda-lime glass, alkali-free glass or the like.

The first layer 320 is formed by the low-temperature CVD process such as PECVD.

The material of the first layer 320 is not limited in particular. The thin film material may be, for example, oxide, nitride and/or oxynitride.

Examples of oxides include SiO$_2$, TiO$_2$, ZnO, SnO and Al$_2$O$_3$. Examples of nitrides include Si$_3$N$_4$, TiN and AlN. Examples of oxynitrides include SiON and TiON.

Here, the glass substrate with a thin film 300 is characterized in that an integrated value after a baseline correction in a wavenumber range of 2600 cm$^{-1}$ to 3800 cm$^{-1}$ in a peak due to OH groups obtained by an FTIR measurement on the first layer 320 is 9.0 or less. This integrated value is preferably 7.0 or less and more preferably 5.5 or less.

Furthermore, in the glass substrate with a thin film 300, the content of C originating from a precursor contained in the first layer 320 is controlled to 1.64 at % or less. The content of C contained in the first layer 320 is preferably 1 at % or less.

As described above, the glass substrate with a thin film 300 having such characteristics is characterized in that defects such as cracks are less likely to be caused in the first layer 320, that is, the heat resistance is significantly high, because the densification of the first layer 320 due to removal of OH groups is less likely to occur at the time of heat treatment. For example, the glass substrate with a thin film 300 according to the present invention has an extremely low haze value, for example, a haze value of 0.2% or less, even after being retained at 650° C. for 10 minutes or more.

Accordingly, the glass substrate with a thin film 300 according to the present invention may be significantly applied in usage in which application of heat treatment follows.

The thickness of the first layer 320 is not limited in particular. The thickness of the first layer 320 may be, for example, in a range of 5 nm to 1000 nm.

[About a Second Glass Substrate with a Thin Film According to the Present Invention]

In the above description, features of the present invention are explained taking a glass substrate with a thin film where a single layer is formed on a glass substrate by the low-temperature CVD process as an example.

The present invention, however, is not limited to such form.

For example, multiple layers may be formed on a surface of a glass substrate with a thin film.

A description is given below, with reference to drawings, of a configuration of such a glass substrate with a thin film having multiple layers of films.

Figure 4:
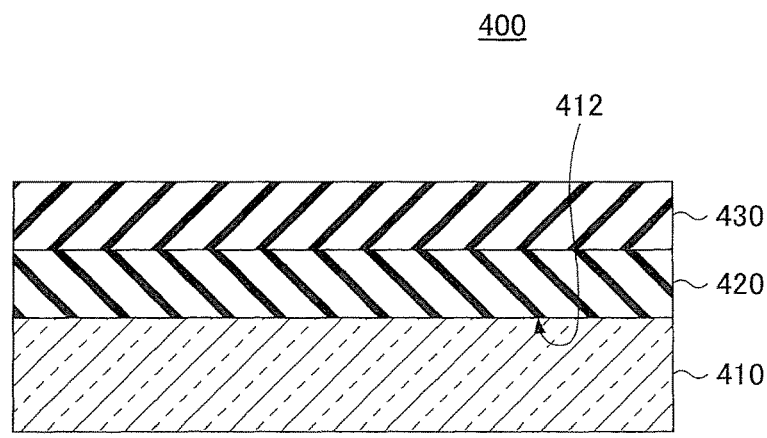
FIG. 4 is a cross-sectional view schematically illustrating a configuration of a second glass substrate with a thin film.

FIG. 4 schematically illustrates a configuration of a second glass substrate with a thin film according to the present invention.

As illustrated in FIG. 4, a second glass substrate with a thin film 400 includes a glass substrate 410, a first layer 420 placed on a surface 412 of the glass substrate 410, and a second layer 430 placed on the first layer 420.

The glass substrate 410 may be a glass substrate like the above-described glass substrate 310 illustrated in FIG. 3.

The first layer 420 is formed by the low-temperature CVD process such as PECVD. Furthermore, the second layer 430 as well is formed by the low-temperature CVD process such as PECVD. The material of the first layer 420 may be different from that of the second layer 430. Each of the layers 420 and 430 may have a thickness in a range of 5 nm to 1000 nm.

Here, the glass substrate with a thin film 400 is characterized in that an integrated value after a baseline correction in a wavenumber range of 2600 cm$^{-1}$ to 3800 cm$^{-1}$ in a peak due to OH groups obtained by an FTIR measurement on the first layer 420 and the second layer 430 is 9.0 or less. That is, in the second glass substrate with a thin film 400, the total amount of the OH groups contained in the first layer 420 and the second layer 430 is significantly controlled.

Furthermore, the total content of C originating from a precursor contained in the first layer 420 and the second layer 430 is controlled to 1.64 at % or less.

It will be clear that according to the second glass substrate with a thin film 400 having such characteristics as well, it is possible to obtain the same effect as that of the above-described glass substrate with a thin film 300, that is, good heat resistance, because the densification of the first layer 420 and the second layer 430 due to removal of OH groups is less likely to occur at the time of heat treatment.

In the case of the second glass substrate with a thin film 400, it is difficult to understand the content of C originating from a precursor contained in each of the first layer 420 and the second layer 430. However, because the glass substrate itself normally contains no C, the value obtained through the measurement result of an ESCA analysis of the whole glass substrate with a thin film 400 may be understood as the total content of C contained in the first layer 420 and the second layer 430. Furthermore, by controlling this total C content, it is possible to increase the heat resistance of the second glass substrate with a thin film 400.

In the above description of the second glass substrate with a thin film 400, each of the first layer 420 and the second layer 430 is a layer formed by the low-temperature CVD process.

The configuration of the second glass substrate with a thin film 400, however, is not limited to this. For example, one of the first layer 420 and the second layer 430 may be a layer formed by a method other than the low-temperature CVD process. Methods other than the low-temperature CVD process may be, but are not limited to, for example, physical vapor deposition such as sputtering and non-low-temperature CVD processes such as thermal CVD.

In layers formed by such methods other than the low-temperature CVD process, the problem that OH groups and a C component originating from a precursor are captured into a layer is less likely to occur.

Accordingly, for example, when the second layer 430 is a layer formed by a method other than the low-temperature CVD process, it is considered that the second layer 430 hardly contains OH groups. In other words, it is considered that the peak due to OH groups obtained by an FTIR measurement on the first layer 420 and the second layer 430 originates from the first layer 420.

Likewise, in this case, it is considered that the second layer 430 hardly contains a C component. Therefore, the value of the amount of C obtained through the measurement result may be presumed to be the amount of the C component contained in the first layer 420.

Accordingly, like in the case of the above-described glass substrate with a thin film 300, according to the second glass substrate with a thin film 400 having such a configuration, it is possible to increase the heat resistance of the glass substrate with a thin film by controlling an integrated value after a baseline correction in a wavenumber range of 2600 cm$^{-1}$ to 3800 cm$^{-1}$ in a peak due to OH groups obtained by an FTIR measurement on the first layer 420 and the second layer 430 to be 9.0 or less and by controlling the measured amount of a C component to be 1.64 at % or less.

[About a Third Glass Substrate with a Thin Film According to the Present Invention]

Figure 5:
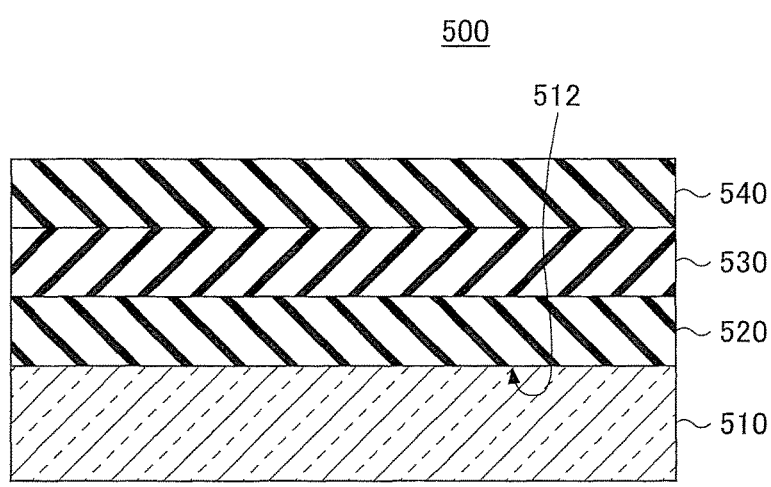
FIG. 5 is a cross-sectional view schematically illustrating a configuration of a third glass substrate with a thin film.

FIG. 5 schematically illustrates a configuration of a third glass substrate with a thin film according to the present invention.

As illustrated in FIG. 5, a third glass substrate with a thin film 500 includes a glass substrate 510, a first layer 520 placed on a surface 512 of the glass substrate 510, a second layer 530 placed on the first layer 520, and a third layer 540 placed on the second layer 530.

The glass substrate 510 may be a glass substrate like the above-described glass substrate 310 illustrated in FIG. 3 and/or glass substrate 410 illustrated in FIG. 4.

The first layer 520 is formed by the low-temperature CVD process such as PECVD. Furthermore, the third layer 540 also is formed by the low-temperature CVD process. The first layer 520 and the third layer 540 may be of the same material or different materials. On the other hand, the second layer 530 is formed by a non-low-temperature CVD process.

Each of the first layer 520 and the third layer 540 may have a thickness in a range of 5 nm to 1000 nm. Furthermore, the second layer 530 may have a thickness in a range of 5 nm to 1000 nm.

Here, the glass substrate with a thin film 500 is characterized in that an integrated value after a baseline correction in a wavenumber range of 2600 cm$^{-1}$ to 3800 cm$^{-1}$ in a peak due to OH groups obtained by an FTIR measurement on the first layer 520 through the third layer 540 is 9.0 or less.

Furthermore, in the glass substrate with a thin film 500, the total content of C originating from a precursor contained in the first layer 520 and the third layer 540 is controlled to 1.64 at % or less.

As described above, in layers formed by methods other than the low-temperature CVD process, the problem that OH groups and a C component originating from a precursor are captured into a layer is less likely to occur. Therefore, it is considered that the second layer 530 hardly contains OH groups and a C component originating from a precursor. In other words, it is considered that the peak due to OH groups obtained by an FTIR measurement on the first layer 520 through the third layer 540 originates from the first layer 520 and the third layer 540.

In the third glass substrate with a thin film 500, the total amount of the OH groups contained in the first layer 520 and the third layer 540 formed by the low-temperature CVD process and the total amount of C contained in both layers are significantly controlled.

Accordingly, in the third glass substrate with a thin film 500 having such characteristics, the densification of the first layer 520 and the third layer 530 due to removal of OH groups is less likely to occur at the time of heat treatment. Accordingly, it will be clear that according to the third glass substrate with a thin film 500 as well, it is possible to obtain the same effect as that of the above-described glass substrates with a thin film 300 and 400, that is, good heat resistance.

A description is given above, with reference to FIG. 5, of a configuration of the third glass substrate with a thin film 500 where the first layer 520 and the third layer 540 alone are formed by the low-temperature CVD process.

The configuration of the third glass substrate with a thin film 500, however, is not limited to this.

For example, the first layer 520 alone may be a layer formed by the low-temperature CVD process and the second layer 530 and the third layer 540 may be layers formed by a non-low-temperature CVD process. As an alternative, the second layer 530 alone may be a layer formed by the low-temperature CVD process and the first layer 520 and the third layer 540 may be layers formed by a non-low-temperature CVD process. As another alternative, the third layer 540 alone may be a layer formed by the low-temperature CVD process and the first layer 520 and the second layer 530 may be layers formed by a non-low-temperature CVD process. As yet another alternative, all of the first layer 520 through the third layer 540 may be layers formed by the low-temperature CVD process.

In addition to these, various multilayer structures are possible. For example, the number of layers is not limited to three, and the number of layers may be four or more.

[About Exemplary Applications of a Glass Substrate with a Thin Film According to the Present Invention]

Next, a brief description is given, with reference to drawings, of exemplary applications of a glass substrate with a thin film according to the present invention.

[Infrared Reflecting Glass]

Figure 6:
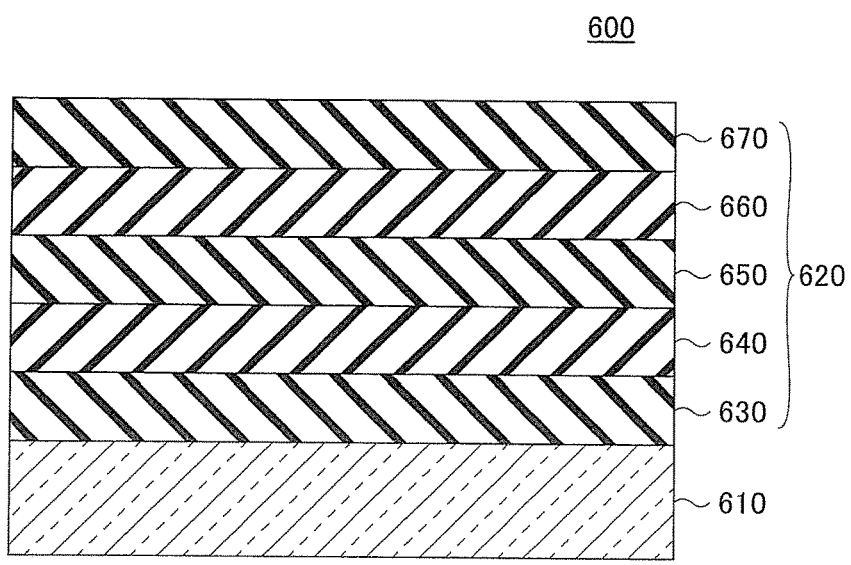
FIG. 6 is a cross-sectional view schematically illustrating an example of infrared reflecting glass.

FIG. 6 schematically illustrates a cross-sectional view of infrared reflecting glass.

As illustrated in FIG. 6, infrared reflecting glass 600 includes a glass substrate 610 and a laminated body 620 of multiple dielectric layers placed on this glass substrate 610.

The laminated body 620 of dielectric layers is formed by laminating, from the side closer to the glass substrate 610, a first dielectric layer 630, a second dielectric layer 640, a third dielectric layer 650, a fourth dielectric layer 660, and a fifth dielectric layer 670.

The first dielectric layer 630 has a first refractive index $n_1$, the second dielectric layer 640 has a second refractive index $n_2$, the third dielectric layer 650 has a third refractive index $n_3$, the fourth dielectric layer 660 has a fourth refractive index $n_4$, and the fifth dielectric layer 670 has a fifth refractive index $n_5$.

Here, the first refractive index $n_1$ of the first dielectric layer 630 is higher than the second refractive index $n_2$ of the second dielectric layer 640, the third refractive index $n_3$ of the third dielectric layer 650 is higher than the second refractive index $n_2$ of the second dielectric layer 640 and the fourth refractive index $n_4$ of the fourth dielectric layer 660, and the fifth refractive index $n_5$ of the fifth dielectric layer 670 is higher than the fourth refractive index $n_4$ of the fourth dielectric layer 660.

The first dielectric layer 630, the third dielectric layer 650, and/or the fifth dielectric layer 670 may be, for example, a $TiO_2$ layer. Furthermore, the second dielectric layer 640 and/or the fourth dielectric layer 660 may be, for example, a $SiO_2$ layer.

The first dielectric layer 630, the third dielectric layer 650, and the fifth dielectric layer 670 may be the same layers, and the second dielectric layer 640 and the fourth dielectric layer 660 may be the same layers.

In the example of FIG. 6, the laminated body 620 formed of five layers in total is placed on the glass substrate 610. This, however, is a mere example, and the laminated body 620 may have six or more layers.

The infrared reflecting glass 600 of such a configuration exhibits high reflectance with respect to the radiation of the infrared region.

Here, the infrared reflecting glass 600 includes a glass substrate with a thin film according to the present invention.

For example, the glass substrate 610 of the infrared reflecting glass 600 may correspond to the glass substrate 310 of the glass substrate with a thin film 300 according to the present invention illustrated in FIG. 3, and one of the first dielectric layer 630 through the fifth dielectric layer 670 of the infrared reflecting glass 600 may be the first layer 320 of the glass substrate with a thin film 300 according to the present invention illustrated in FIG. 3.

As an alternative, for example, the glass substrate 610 of the infrared reflecting glass 600 may correspond to the glass substrate 410 of the second glass substrate with a thin film 400 according to the present invention illustrated in FIG. 4, and successive two layers of the first dielectric layer 630 through the fifth dielectric layer 670 of the infrared reflecting glass 600 may correspond to the first layer 420 and the second layer 430 of the second glass substrate with a thin film 400 illustrated in FIG. 4.

As another alternative, for example, the glass substrate 610 of the infrared reflecting glass 600 may correspond to the glass substrate 510 of the third glass substrate with a thin film 500 according to the present invention illustrated in FIG. 5, and successive three layers of the first dielectric layer 630 through the fifth dielectric layer 670 of the infrared reflecting glass 600 may correspond to the first layer 520 through the third layer 540 of the third glass substrate with a thin film 500 illustrated in FIG. 5.

When the infrared reflecting glass 600 includes such a glass substrate with a thin film according to the present invention, it is possible to increase the heat resistance of the infrared reflecting glass 600. Accordingly, it is possible to subject the infrared reflecting glass 600 to heat treatment, for example, for bending.

[Visible Light Anti-Reflection Glass]

Figure 7:
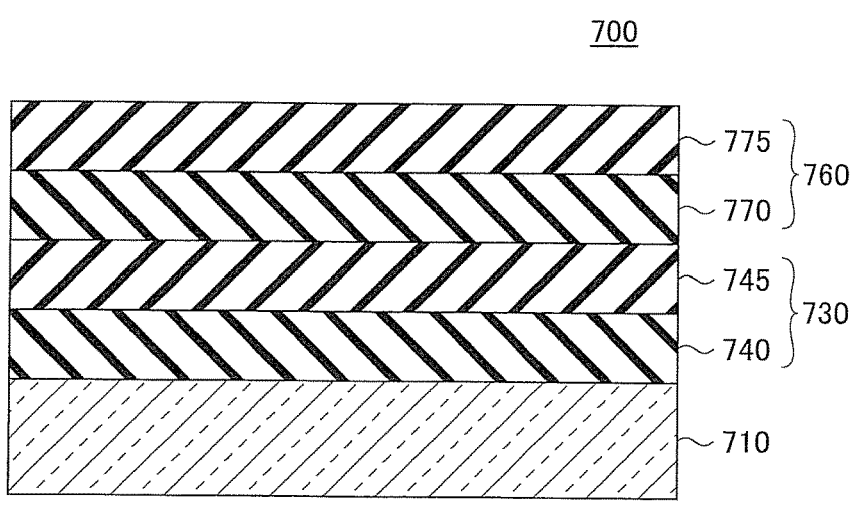
FIG. 7 is a cross-sectional view schematically illustrating an example of visible light anti-reflection glass.

FIG. 7 schematically illustrates a cross-sectional view of visible light anti-reflection glass.

As illustrated in FIG. 7, visible light anti-reflection glass 700 includes a glass substrate 710, a first laminated body 730 placed on this glass substrate 710, and a second laminated body 760 placed on this first laminated body 730.

The first laminated body 730 is formed by laminating a first dielectric layer 740 having a first refractive index $n_1$ and a second dielectric layer 745 having a second refractive index $n_2$ in this order. The first refractive index $n_1$ of the first dielectric layer 740 is higher than the second refractive index $n_2$ of the second dielectric layer 745. The first dielectric layer 740 may be, for example, a $TiO_2$ layer, and the second dielectric layer 745 may be, for example, a $SiO_2$ layer.

The second laminated body 760 has the same configuration as the first laminated body 730. That is, the second laminated body 760 is formed by laminating a third dielectric layer 770 having a third refractive index $n_3$ and a fourth dielectric layer 775 having a fourth refractive index $n_4$ in this order. The third refractive index $n_3$ of the third dielectric layer 770 is higher than the fourth refractive index $n_4$ of the fourth dielectric layer 775. The third dielectric layer 770 may be, for example, a $TiO_2$ layer, and the fourth dielectric layer 775 may be, for example, a $SiO_2$ layer.

The first laminated body 730 and the second laminated body 760 may have the same configuration.

In the example of FIG. 7, the two laminated bodies 730 and 760 are placed on the glass substrate 710. This, however, is a mere example, and three or more laminated bodies of a high refractive index dielectric layer and a low refractive index dielectric layer may be stacked in layers.

The visible light anti-reflection glass 700 of such a configuration exhibits low reflectance with respect to visible light.

Here, the visible light anti-reflection glass 700 includes a glass substrate with a thin film according to the present invention.

For example, the glass substrate 710 of the visible light anti-reflection glass 700 may correspond to the glass substrate 310 of the glass substrate with a thin film 300 according to the present invention illustrated in FIG. 3, and one of the first dielectric layer 740 through the fourth dielectric layer 775 of the visible light anti-reflection glass 700 may be the first layer 320 of the glass substrate with a thin film 300 according to the present invention illustrated in FIG. 3.

As an alternative, for example, the glass substrate 710 of the visible light anti-reflection glass 700 may correspond to the glass substrate 410 of the second glass substrate with a thin film 400 according to the present invention illustrated in FIG. 4, and two of the first dielectric layer 740 through the fourth dielectric layer 775 of the visible light anti-reflection glass 700 may correspond to the first layer 420 and the second layer 430 of the second glass substrate with a thin film 400 illustrated in FIG. 4.

As an alternative, for example, the glass substrate 710 of the visible light anti-reflection glass 700 may correspond to the glass substrate 510 of the third glass substrate with a thin film 500 according to the present invention illustrated in FIG. 5, and three of the first dielectric layer 740 through the fourth dielectric layer 775 of the visible light anti-reflection glass 700 may correspond to the first layer 520 through the third layer 540 of the third glass substrate with a thin film 500 illustrated in FIG. 5.

When the visible light anti-reflection glass 700 includes such a glass substrate with a thin film according to the present invention, it is possible to increase the heat resistance of the visible light anti-reflection glass 700. Accordingly, it is possible to subject the visible light anti-reflection glass 700 to heat treatment, for example, for bending.

[Low-E Glass]

Figure 8:
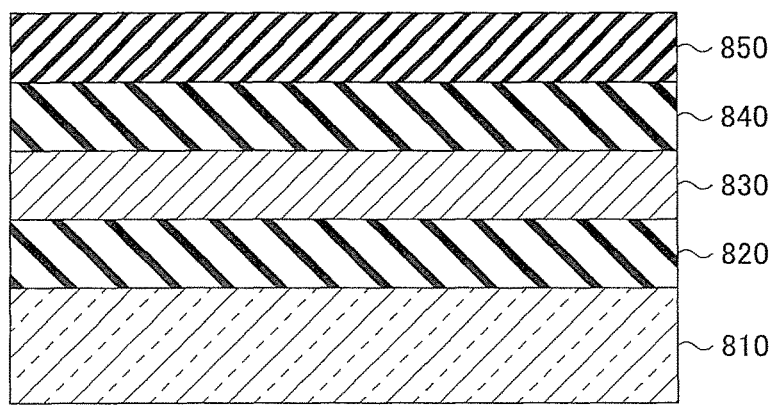
FIG. 8 is a cross-sectional view schematically illustrating an example of Low-E glass.

FIG. 8 schematically illustrates a cross-sectional view of Low-E glass.

As illustrated in FIG. 8, Low-E glass 800 includes a glass substrate 810, a silver layer 830, and a top layer 850 placed at the top of the Low-E glass.

The silver layer 830 is interposed between a lower first dielectric layer 820 and an upper second dielectric layer 840. Normally, the top layer 850 is formed of a layer of a dielectric such as $SiO_2$, and has the function of controlling reflection of visible light.

According to the Low-E glass 800 of such a configuration, because radiation from the glass is controlled, it is possible to obtain high heat shielding and heat insulation characteristics.

Here, the Low-E glass 800 includes a glass substrate with a thin film according to the present invention.

For example, the glass substrate 810 and the top layer 850 of the Low-E glass 800 may be the glass substrate 310 and the first layer 320, respectively, of the glass substrate with a thin film 300 according to the present invention illustrated in FIG. 3.

As an alternative, for example, the glass substrate 810 and the top layer 850 of the Low-E glass 800 may be the glass substrate 410 and the second layer 430, respectively, of the second glass substrate with a thin film 400 according to the present invention illustrated in FIG. 4. In this case, the first layer 420 of the second glass substrate with a thin film 400 may correspond to the first dielectric layer 820 or the second dielectric layer 840.

As another alternative, for example, the glass substrate 810 and the top layer 850 of the Low-E glass 800 may be the glass substrate 510 and the third layer 540, respectively, of the third glass substrate with a thin film 500 according to the present invention illustrated in FIG. 5. In this case, the first layer 520 of the third glass substrate with a thin film 500 may correspond to the first dielectric layer 820, and the second layer 530 of the third glass substrate with a thin film 500 may correspond to the second dielectric layer 840.

When the Low-E glass 800 includes such a glass substrate with a thin film according to the present invention, it is possible to increase the heat resistance of the Low-E glass 800. Accordingly, it is possible to subject the Low-E glass 800 to heat treatment, for example, for bending.

The Low-E glass 800 of the configuration illustrated in FIG. 8 is a mere example, and the Low-E glass may have other configurations.

Figure 9:
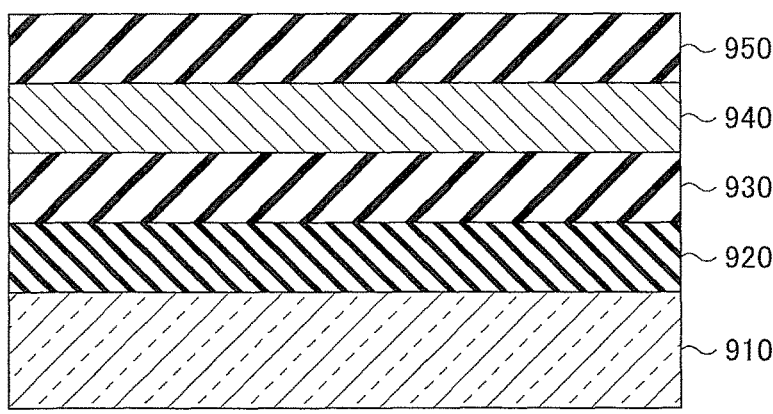
FIG. 9 is a cross-sectional view schematically illustrating another example of Low-E glass.

FIG. 9 schematically illustrates a cross-sectional view of Low-E glass of another configuration.

As illustrated in FIG. 9, this Low-E glass 900 is formed by laminating a glass substrate 910, a bottom layer 920 placed on the glass substrate 910, a first dielectric layer 930 placed on the bottom layer 920, a silver layer 940 placed on the first dielectric layer 930, and a second dielectric layer 950 placed on the silver layer 940 in this order.

The bottom layer 920 has the function of controlling diffusion of an alkali metal from the glass substrate 910 toward the silver layer 940. The bottom layer 920 is formed of a layer of a dielectric such as $SiO_2$.

Here, the Low-E glass 900 includes a glass substrate with a thin film according to the present invention.

For example, the glass substrate 910 and the bottom layer 920 of the Low-E glass 900 may be the glass substrate 310 and the first layer 320, respectively, of the glass substrate with a thin film 300 according to the present invention illustrated in FIG. 3.

When the Low-E glass 900 includes such a glass substrate with a thin film according to the present invention, it is possible to increase the heat resistance of the Low-E glass 900. Accordingly, it is possible to subject the Low-E glass 900 to heat treatment, for example, for bending.

As an alternative, for example, the glass substrate 910 and the bottom layer 920 of the Low-E glass 900 may be the glass substrate 410 and the first layer 420, respectively, of the second glass substrate with a thin film 400 according to the present invention illustrated in FIG. 4. In this case, the second layer 430 of the second glass substrate with a thin film 400 may correspond to the first dielectric layer 930 or the second dielectric layer 950.

As another alternative, for example, the glass substrate 910 and the bottom layer 920 of the Low-E glass 900 may be the glass substrate 510 and the first layer 520, respectively, of the third glass substrate with a thin film 500 according to the present invention illustrated in FIG. 5. In this case, the second layer 530 of the third glass substrate with a thin film 500 may correspond to the first dielectric layer 930, and the third layer 540 of the third glass substrate with a thin film 500 may correspond to the second dielectric layer 950.

EXAMPLES

A description is given below of examples of the present invention.

Example 1

Sample 1 was made by depositing a $SiO_2$ thin film on a substrate and its characteristics were evaluated in the following manner.

[Deposition of a $SiO_2$ Thin Film]

A PECVD apparatus was used to deposit a $SiO_2$ thin film. The plasma gas was oxygen gas (of a flow rate of 2000 sccm/m), and the plasma power was 20 kW/m. Tetramethyldisiloxane was used as a source gas. The flow rate of the source gas was 250 sccm/m.

A soda-lime glass substrate of 300 mm in length, 300 mm in width, and 2 mm in thickness was used as the substrate. The substrate was not heated at the time of film deposition.

A $SiO_2$ thin film of approximately 226 nm in thickness was formed on the substrate by the PECVD process. The deposition rate calculated from the deposition time and the thickness of the $SiO_2$ thin film was 226 nm m/min.

In the row of "Example 1" of Table 1 below, the plasma power, the flow rate of a precursor, the flow rate of an oxygen gas for plasma, the deposition rate, and the thickness of a SiO₂ thin film at the time of making Sample 1 are shown together.

Furthermore, haze values of Sample 1 were measured with a haze meter (Haze Meter HZ-2, manufactured by Suga Test Instruments Co., Ltd.).

TABLE 1

| No. | PLASMA POWER (kW/m) | FLOW RATE OF PRECURSOR (sccm/m) | FLOW RATE OF OXYGEN (sccm/m) | DEPOSITION RATE (nm · m/min) | THICKNESS (nm) | INTEGRATED VALUE OF PEAK DUE TO OH GROUPS | HAZE VALUE (650° C.) (%) | HAZE VALUE (700° C.) (%) | C CONTENT (at %) |
|---|---|---|---|---|---|---|---|---|---|
| EXAMPLE 1 | 20 | 250 | 2000 | 226 | 226 | 8.7 | 0.16 | 1.01 | 0.55 |
| EXAMPLE 2 | 25 | 250 | 2000 | 221 | 221 | 7.7 | 0.16 | 0.55 | 0.21 |
| EXAMPLE 3 | 25 | 187.5 | 1500 | 151.2 | 216 | 7.0 | 0.10 | 0.20 | 0.24 |
| EXAMPLE 4 | 25 | 125 | 1000 | 89.6 | 224 | 5.1 | 0.06 | 0.13 | 0.24 |
| COMPARATIVE EXAMPLE 1 | 10 | 250 | 2000 | 252 | 252 | 8.1 | 0.61 | 1.92 | 4.30 |
| COMPARATIVE EXAMPLE 2 | 15 | 250 | 2000 | 240 | 240 | 9.8 | 0.45 | 1.86 | 1.64 |

[Evaluations of the Sample]

Next, various evaluations were performed using obtained Sample 1.

First, an FTIR spectroscopy measurement was performed on the SiO₂ thin film of obtained Sample 1. At this point, the FTIR absorbance of the SiO₂ thin film was measured by performing the FTIR spectroscopy measurement on Sample 1 and the same kind of glass substrate as used for Sample 1 and taking a difference between their respective absorbances. An FTIR spectrometer (Nicolet 6700 FT-IR, manufactured by Thermo Scientific Inc.) was used for the FTIR spectroscopy measurement.

Figure 10:
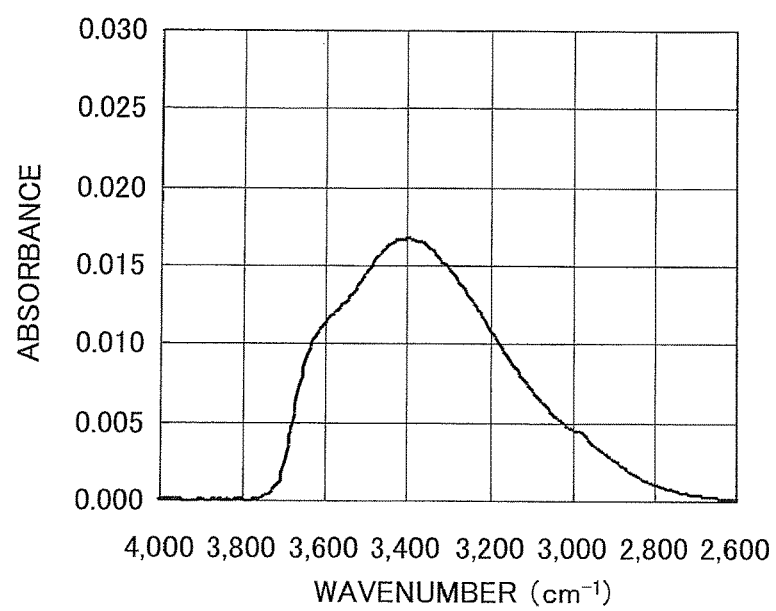
FIG. 10 is a chart illustrating an FTIR measurement result in a sample (Sample 1) according to Example 1.

FIG. 10 illustrates an enlarged view of part of the result of the FTIR measurement. This drawing illustrates data after correction of the baseline of the measurement result. The baseline correction was performed by the automatic baseline correction of software (OMNIC software, manufactured by Thermo Scientific Inc.) accompanied to the FTIR spectrometer. According to the automatic baseline correction, an operation to remove inclination or undulation generated in a spectral waveform because of the effect of the light scattering of a sample and the like by approximating the inclination or undulation by a polynomial curve is performed.

As is seem from FIG. 10, a broad absorption peak due to OH groups was observed at a position around a wavenumber of approximately 3400 $cm^{-1}$. From this result, the integrated value of the peak in a wavenumber range of 2600 $cm^{-1}$ to 3800 $cm^{-1}$ was determined, and the peak integrated value was 8.7.

Next, the content of C (carbon) contained in the SiO₂ thin film of Sample 1 was measured. The C content was measured by ESCA instrument (PHI 5000 VersaProbe II, manufactured by ULVAC-PHI, INCORPORATED).

As a result of the measurement, the content of C contained in the SiO₂ thin film was 0.55 at %.

Next, the heat resistance of Sample 1 was evaluated. The evaluation of heat resistance was performed by measuring a haze value after subjecting Sample 1 to heat treatment. Here, "haze" is one of the indices of the transparency of a sample, and is used in expressing the turbidity (cloudiness) of a sample. When defects such as cracks are caused in the SiO₂ thin film by heat treatment, the turbidity of the sample increases so as to increase a haze value. Accordingly, it is possible to evaluate the heat resistance of the sample by measuring a haze value.

Heat treatment was performed by retaining Sample 1 at 650° C. and at 700° C. for 17 minutes in the atmosphere.

As a result of the measurement, the haze value of Sample 1 by the heat treatment at 650° C. was 0.16, and it was found that the turbidity of Sample 1 after the heat treatment at 650° C. was extremely low. Furthermore, abnormalities such as cracks were not recognized in particular in the SiO₂ thin film of Sample 1 in a visual observation. From this result, it was determined that Sample 1 has extremely good heat resistance with defects such as cracks being hardly caused after the heat treatment at 650° C.

Furthermore, the haze value by the heat treatment at 700° C. was 1.01, and it was found that the turbidity of Sample 1 after the heat treatment at 700° C. was low. Thus, it was determined that Sample 1 has good heat resistance even after the heat treatment at 700° C.

In the row of "Example 1" of Table 1 described above, the integrated value of a peak due to OH groups, the haze values after heat treatment at 650° C. and 700° C., and the C content are shown together.

Example 2

Sample 2 was made by depositing a SiO₂ thin film on a substrate and its characteristics were evaluated in the same manner as in Example 1. In this Example 2, however, the plasma power was 25 kW/m, the deposition rate was 221 nm m/min, and the thickness of the SiO₂ thin film was 221 nm. The other conditions are the same as in the case of Example 1.

Figure 11:
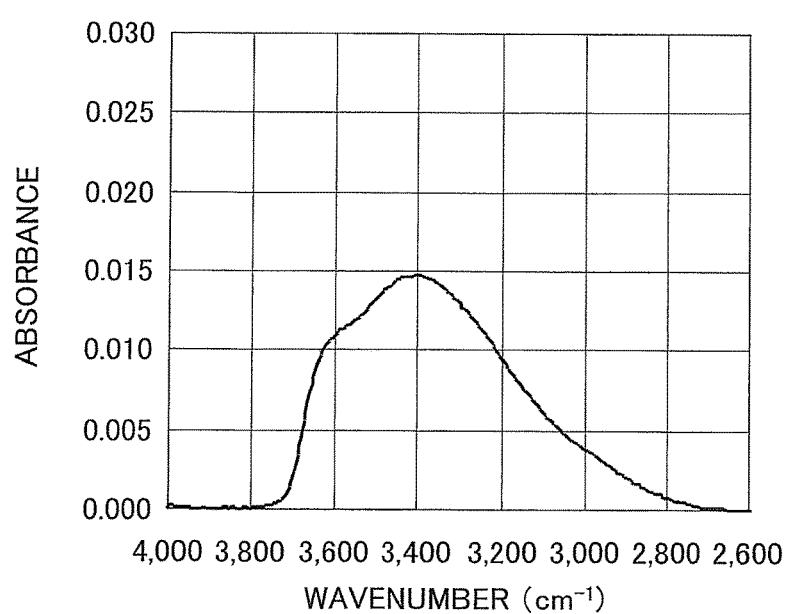
FIG. 11 is a chart illustrating an FTIR measurement result in a sample (Sample 2) according to Example 2.

FIG. 11 illustrates an enlarged view of the result of an FTIR measurement on the SiO₂ thin film of Sample 2 (after a baseline correction). The integrated value of a peak in a wavenumber range of 2600 $cm^{-1}$ to 3800 $cm^{-1}$ m was determined, and the peak integrated value was 7.7.

As a result of measuring the content of C (carbon) contained in the SiO₂ thin film by ESCA, the C content was 0.21 at %.

The haze value of Sample 2 after heat treatment at 650° C. was 0.16. Furthermore, abnormalities such as cracks were not recognized in particular in the SiO₂ thin film of Sample 2 in a visual observation. From this result, it was determined that Sample 2 has extremely good heat resistance with defects such as cracks being hardly caused after the heat treatment at 650° C. Furthermore, the haze value of Sample 2 heat-treated at 700° C. was 0.55, and it was found that the turbidity of Sample 2 after the heat treatment at 700° C. was low. Thus, it was determined that Sample 2 has good heat resistance even after the heat treatment at 700° C.

In the row of "Example 2" of Table 1 described above, the typical deposition conditions, the integrated value of a peak due to OH groups, the haze values after heat treatment at 650° C. and 700° C., and the C content of Sample 2 are shown together.

Example 3

Sample 3 was made by depositing a $SiO_2$ thin film on a substrate and its characteristics were evaluated in the same manner as in Example 1. In this Example 3, however, the plasma power was 25 kW/m, the flow rate of a precursor was 187.5 sccm/m, the flow rate of an oxygen plasma gas was 1500 sccm/m, the deposition rate was 151 nm m/min, and the thickness of the $SiO_2$ thin film was 216 nm. The other conditions are the same as in the case of Example 1.

Figure 12:
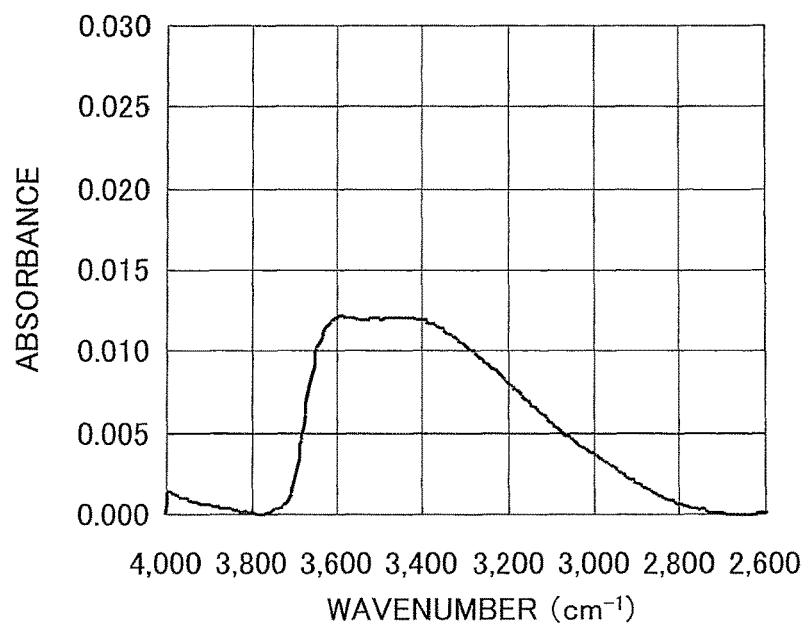
FIG. 12 is a chart illustrating an FTIR measurement result in a sample (Sample 3) according to Example 3.

FIG. 12 illustrates an enlarged view of the result of an FTIR measurement on the $SiO_2$ thin film of Sample 3 (after a baseline correction). The integrated value of a peak in a wavenumber range of 2600 $cm^{-1}$ to 3800 $cm^{-1}$ was determined, and the peak integrated value was 7.0.

As a result of measuring the content of C (carbon) contained in the $SiO_2$ thin film, the C content was 0.24 at %.

The haze value of Sample 3 after heat treatment at 650° C. was 0.10. Furthermore, abnormalities such as cracks were not recognized in particular in the $SiO_2$ thin film of Sample 3 in a visual observation. From this result, it was determined that Sample 3 has extremely good heat resistance with defects such as cracks being hardly caused after the heat treatment at 650° C. Furthermore, the haze value of Sample 3 heat-treated at 700° C. was 0.20, and it was found that the turbidity of Sample 3 after the heat treatment at 700° C. also was extremely low. Furthermore, abnormalities such as cracks were not recognized in particular in the $SiO_2$ thin film of Sample 3 in a visual observation. From this result, it was determined that Sample 3 has extremely good heat resistance with defects such as cracks being hardly caused even after the heat treatment at 700° C.

In the row of "Example 3" of Table 1 described above, the typical deposition conditions, the integrated value of a peak due to OH groups, the haze values after heat treatment at 650° C. and 700° C., and the C content of Sample 3 are shown together.

Example 4

Sample 4 was made by depositing a $SiO_2$ thin film on a substrate and its characteristics were evaluated in the same manner as in Example 1. In this Example 4, however, the plasma power was 25 kW/m, the flow rate of a precursor was 125 sccm/m, the flow rate of an oxygen plasma gas was 1000 sccm/m, the deposition rate was 90 nm m/min, and the thickness of the $SiO_2$ thin film was 224 nm. The other conditions are the same as in the case of Example 1.

Figure 13:
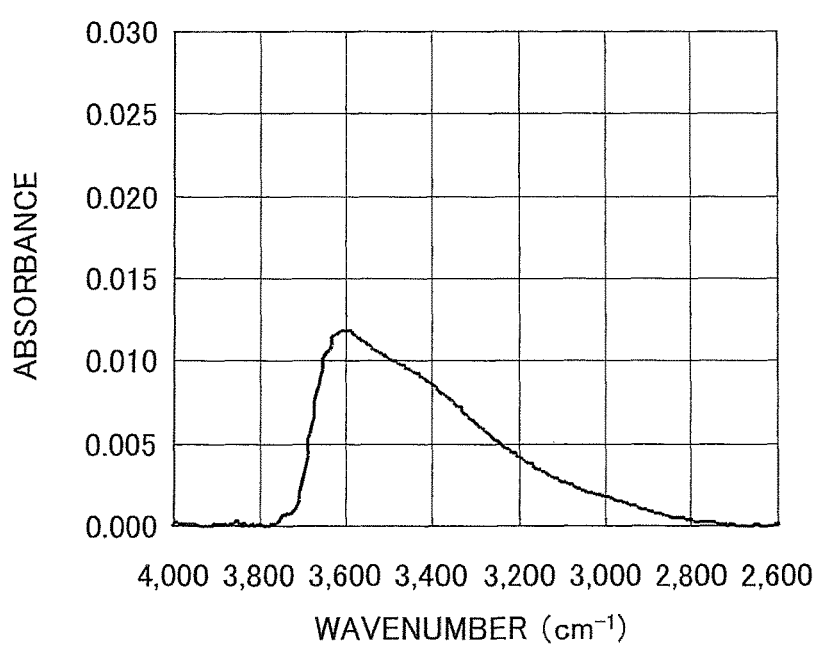
FIG. 13 is a chart illustrating an FTIR measurement result in a sample (Sample 4) according to Example 4.

FIG. 13 illustrates an enlarged view of the result of an FTIR measurement on the $SiO_2$ thin film of Sample 4 (after a baseline correction). The integrated value of a peak in a wavenumber range of 2600 $cm^{-1}$ to 3800 $cm^{-1}$ was determined, and the peak integrated value was 5.1.

As a result of measuring the content of C (carbon) contained in the $SiO_2$ thin film, the C content was 0.24 at %.

The haze value of Sample 4 after heat treatment at 650° C. was 0.06. Furthermore, abnormalities such as cracks were not recognized in particular in the $SiO_2$ thin film of Sample 4 in a visual observation. From this result, it was determined that Sample 4 has extremely good heat resistance with defects such as cracks being hardly caused after the heat treatment at 650° C. Furthermore, the haze value of Sample 4 in heat treatment at 700° C. was 0.13, and it was found that the turbidity of Sample 4 after the heat treatment at 700° C. also was extremely low. Furthermore, abnormalities such as cracks were not recognized in particular in the $SiO_2$ thin film of Sample 4 in a visual observation. From this result, it was determined that Sample 4 has extremely good heat resistance with defects such as cracks being hardly caused even after the heat treatment at 700° C.

In the row of "Example 4" of Table 1 described above, the typical deposition conditions, the integrated value of a peak due to OH groups, the haze values after heat treatment at 650° C. and 700° C., and the C content of Sample 4 are shown together.

Comparative Example 1

Sample 5 was made by depositing a $SiO_2$ thin film on a substrate and its characteristics were evaluated in the same manner as in Example 1. In this Comparative Example 1, however, the plasma power was 10 kW/m, the flow rate of a precursor was 100 sccm/m, the flow rate of an oxygen plasma gas was 800 sccm/m, the deposition rate was 252 nm m/min, and the thickness of the $SiO_2$ thin film was 252 nm. The other conditions are the same as in the case of Example 1.

Figure 14:
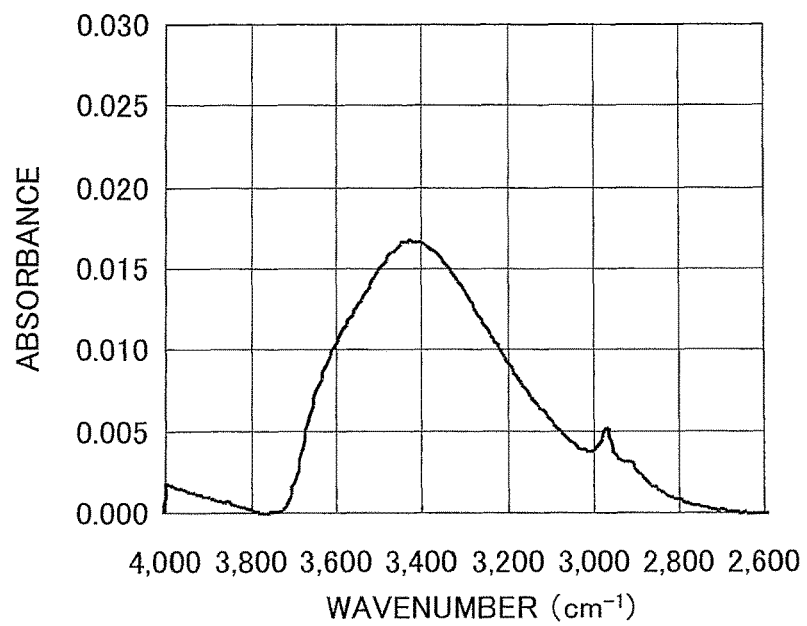
FIG. 14 is a chart illustrating an FTIR measurement result in a sample (Sample 5) according to Comparative Example 1.

FIG. 14 illustrates an enlarged view of the result of an FTIR measurement on the $SiO_2$ thin film of Sample 5 (after a baseline correction). The integrated value of a peak in a wavenumber range of 2600 $cm^{-1}$ to 3800 $cm^{-1}$ was determined, and the peak integrated value was 8.1.

As a result of measuring the content of C (carbon) contained in the $SiO_2$ thin film, the C content was 4.30 at %.

The haze values after heat treatment at 650° C. and 700° C. were 0.61 and 1.92, respectively. From this, it was found that the turbidity of Sample 5 after heat treatment markedly increases. Furthermore, in a visual observation, it was recognized that a large number of cracks were caused in the $SiO_2$ thin film of Sample 5 after the heat treatment at 650° C. and 700° C. From this result, it was determined that Sample 5 does not exhibit good heat resistance.

In the row of "Comparative Example 1" of Table 1 described above, the typical deposition conditions, the integrated value of a peak due to OH groups, the haze values after heat treatment at 650° C. and 700° C., and the C content of Sample 5 are shown together.

Comparative Example 2

Sample 6 was made by depositing a $SiO_2$ thin film on a substrate and its characteristics were evaluated in the same manner as in Comparative Example 1. In this Comparative Example 2, however, the plasma power was 15 kW/m, the deposition rate was 240 nm-m/min, and the thickness of the $SiO_2$ thin film was 240 nm. The other conditions are the same as in the case of Comparative Example 1.

Figure 15:
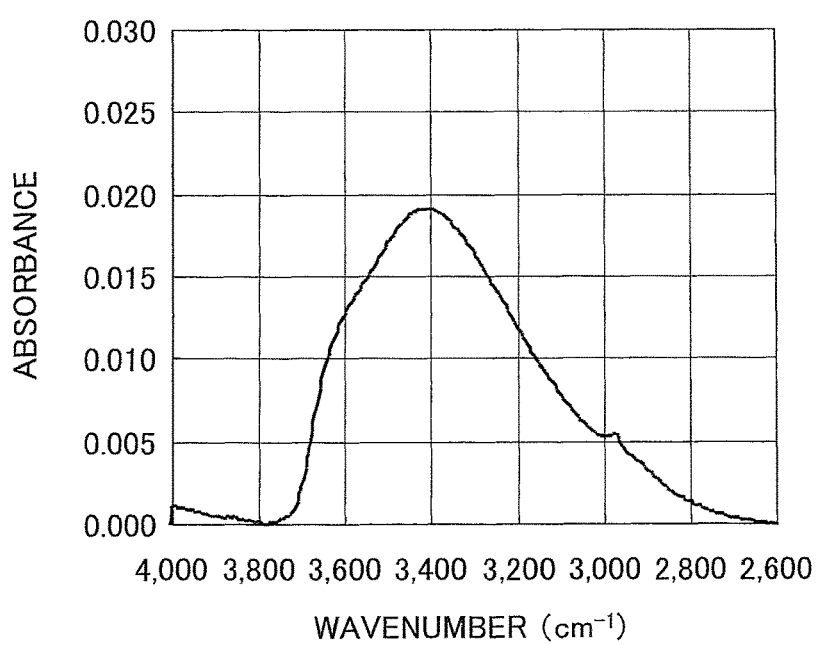
FIG. 15 is a chart illustrating an FTIR measurement result in a sample (Sample 6) according to Comparative Example 2.

FIG. 15 illustrates an enlarged view of the result of an FTIR measurement on the $SiO_2$ thin film of Sample 6 (after a baseline correction). The integrated value of a peak in a wavenumber range of 2600 $cm^{-1}$ to 3800 $cm^{-1}$ was determined, and the peak integrated value was 9.8.

As a result of measuring the content of C (carbon) contained in the $SiO_2$ thin film, the C content was 1.64 at %.

The haze values after heat treatment at 650° C. and 700° C. were 0.45 and 1.86, respectively. From this, it was found that the turbidity of Sample 6 after heat treatment is high. Furthermore, in a visual observation, it was recognized that a large number of cracks were caused in the SiO$_2$ thin film of Sample 6 after the heat treatment at 650° C. and 700° C. From this result, it was determined that Sample 6 does not exhibit good heat resistance.

In the row of "Comparative Example 2" of Table 1 described above, the typical deposition conditions, the integrated value of a peak due to OH groups, the haze values after heat treatment at 650° C. and 700° C., and the C content of Sample 6 are shown together.

Figure 16:
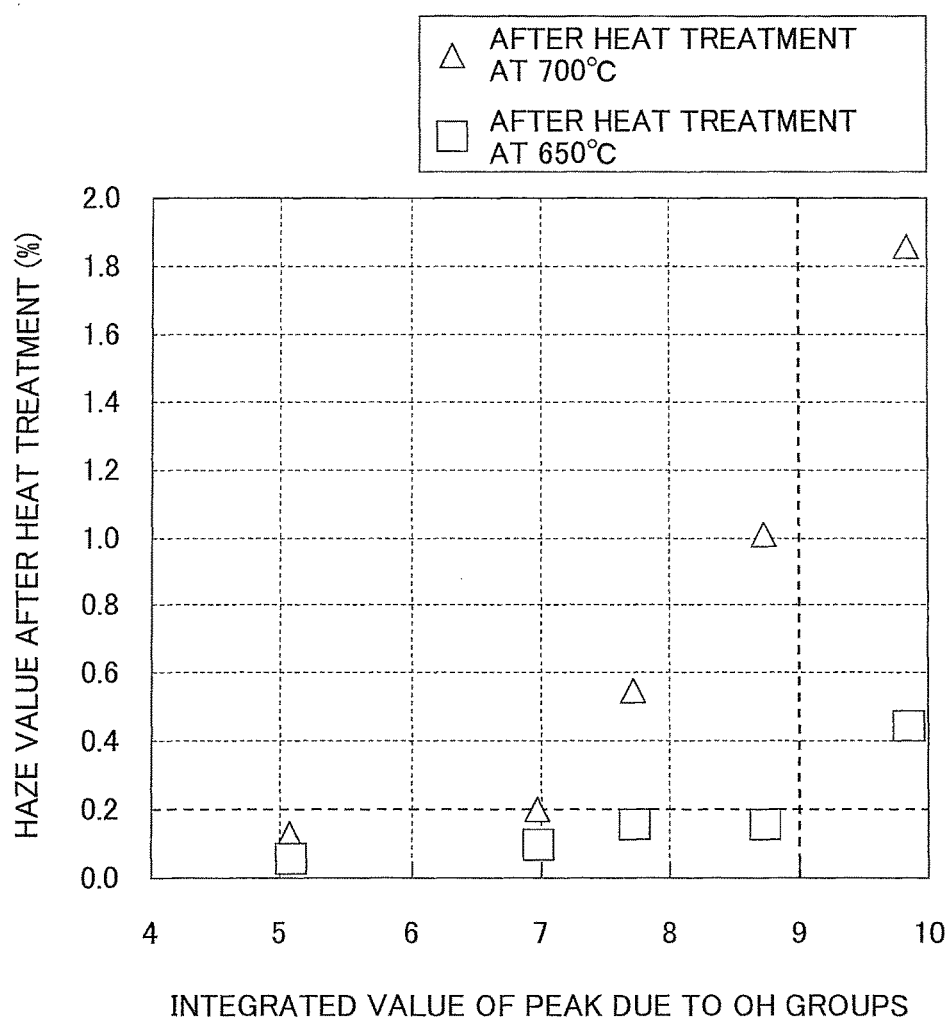
FIG. 16 is a graph illustrating the relationship between the integrated values of a peak due to OH groups and the haze values after heat treatment obtained in Samples 1 through 6.

FIG. 16 illustrates the relationship between the integrated values of a peak due to OH groups and the haze values after heat treatment at each of 650° C. and 700° C. obtained in Samples 1 through 6. Sample 5 is not plotted because the C content exceeds 1.64%.

From this FIG. 16, it is found that in the case of heat treatment at 650° C., the haze values after heat treatment of the samples markedly increase when the integrated value of a peak due to OH groups obtained by an FTIR measurement exceeds approximately 9.0. This result shows that the heat resistance of the samples significantly decreases when the integrated value of a peak due to OH groups exceeds approximately 9.0.

Furthermore, it is found that the haze values of the samples after heat treatment at 700° C. markedly increase when the integrated value of a peak due to OH groups exceeds approximately 7.0. This result shows that in the case of heat treatment at 700° C., the heat resistance of the samples significantly decreases when the integrated value of a peak due to OH groups exceeds approximately 7.0.

On the other hand, according to the heat treatment at 650° C., the haze values after heat treatment of the samples are kept low values less than 0.2 when the integrated value of a peak due to OH groups is approximately 9.0 or less. From this, it has been determined that the heat resistance of the samples significantly increases when the integrated value of a peak due to OH groups is approximately 9.0 or less.

Likewise, according to the heat treatment at 700° C., the haze values after heat treatment of the samples are kept low values less than 0.2 when the integrated value of a peak due to OH groups obtained by an FTIR measurement is approximately 0.7 or less. From this, it has been determined that the heat resistance at 700° C. of the samples significantly increases when the integrated value of a peak due to OH groups is approximately 7.0 or less.

The present invention may be used for film deposition techniques using CVD processes, and so forth.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A method of producing a glass substrate having a first layer formed on a surface of the substrate by low-temperature CVD, the method comprising:
    preparing the glass substrate; and
    forming the first layer on the glass substrate by the low-temperature CVD,
    wherein the first layer is formed on a surface of the glass substrate at a plasma power of 20 kW/m or higher, and
    wherein, in the glass substrate after said forming the first layer, an integrated value after a baseline correction in a wavenumber range of 2600 cm$^{-1}$ to 3800 cm$^{-1}$ in a peak due to OH groups obtained by an FTIR measurement on the first layer is 9.0 or less, and a C content of the first layer is 1.64 at % or less.

2. The method as claimed in claim 1, wherein said forming the first layer includes supplying the glass substrate with an organic metal precursor.

3. The method as claimed in claim 2, wherein the organic metal precursor includes at least one component selected from the group consisting of Si, Ti, Zn, Sn and Al.

4. The method as claimed in claim 2, wherein the organic metal precursor includes at least one component selected from the group consisting of a —CH$_3$ group, a —OH group and a —H group.

5. The method as claimed in claim 1, wherein the first layer is at least one of oxide, nitride, and oxynitride.

6. The method as claimed in claim 1, wherein said forming the first layer is performed at a deposition rate in a range of 50 nm·m/min to 400 nm·m/min.

7. The method as claimed in claim 1, wherein the low-temperature CVD is PECVD.

8. The method as claimed in claim 1, further comprising: forming a second layer over the glass substrate by a method other than the low-temperature CVD.

9. The method as claimed in claim 8, wherein said forming the second layer is performed before or after said forming the first layer.

10. The method as claimed in claim 8, further comprising: forming a third layer over the glass substrate by the low-temperature CVD after said forming the first layer.

11. The method as claimed in claim 10, wherein, in the glass substrate after said forming the third layer, an integrated value after the baseline correction in the wavenumber range of 2600 cm$^{-1}$ to 3800 cm$^{-1}$ in a peak due to OH groups obtained by an FTIR measurement on the first through third layers is 9.0 or less.

12. The method as claimed in claim 8, wherein the method other than the low-temperature CVD is sputtering or thermal CVD.

* * * * *